United States Patent
Wang et al.

(10) Patent No.: US 6,281,098 B1
(45) Date of Patent: *Aug. 28, 2001

(54) PROCESS FOR POLYCRYSTALLINE FILM SILICON GROWTH

(75) Inventors: Tihu Wang, Littleton; Theodore F. Ciszek, Evergreen, both of CO (US)

(73) Assignee: Midwest Research Institute, Kansas City, MO (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/334,166

(22) Filed: Jun. 15, 1999

(51) Int. Cl.[7] .............................. H01L 21/20; H01L 21/36

(52) U.S. Cl. .......................... 438/488; 438/479; 136/243; 117/88; 117/99; 118/669; 118/726; 423/349

(58) Field of Search ........................... 438/488; 136/243; 117/97, 88, 99; 118/725, 726; 423/350, 345

(56) References Cited

U.S. PATENT DOCUMENTS

| | | | |
|---|---|---|---|
| 3,006,737 | 10/1961 | Moates | 23/264 |
| 3,020,129 | 2/1962 | Herrick | 23/223.5 |
| 4,154,870 | * 5/1979 | Wakefield | 423/350 |
| 4,910,163 | 3/1990 | Jain | 437/81 |
| 5,810,934 | * 9/1998 | Lord et al. | 118/725 |
| 6,110,290 | * 8/2000 | Maeda | 118/725 |

OTHER PUBLICATIONS

CRC Handbook of Physics and Chemistry, 63rd Edition, p. D–40 (1984.*

Druminski, M. "Optimization of the Deposition Conditions for Epitaxial Silicon Films on Czochralski Sapphire it the Silane–Hydrogen System," J. Electrochem. Soc. vol. 127, No. 4. 04/80, pp. 957–961.

Chu, T.L. et al.., "Deposition and Properties of Silicon on Graphite Substrates," J. Electrochem. Soc. vol. 123, No. 1. 1/76, pp. 106–110.

Szekely, G. "Preparation of Pure Silicon by the Hydrogen Reduction of Silicon Tetraiodide," J. Electrochem. Soc. vol. 104, No. 11. 11/57, pp. 663–667.

Litton, F.B. et al.. "High Purity Silicon," J. Electrochem. Soc. vol. 101, No. 6. 06/54, pp. 287–292.

Herrick, C.S. et al.. "High–purity Silicon from an Iodide Process Plant," J. Electrochem. Soc. vol. 107, No. 2. 02/60, pp. 111–117.

Glang, R. et al; "Impurity Introduction during Epitaxial Growth of Silicon," IBM Journal, 07/60, pp. 299–301.

Glang, R. et al "Silicon" in The Art and Science of Growing Crystals, Editor J.J. Gilman, John Wiley & Sons, New York, 1963, pp. 80–87.

(List continued on next page.)

Primary Examiner—Charles Bowers
Assistant Examiner—Asok Kumar Sarkar
(74) Attorney, Agent, or Firm—Paul J. White

(57) ABSTRACT

A process for depositing polycrystalline silicon on substrates, including foreign substrates, occurs in a chamber at about atmospheric pressure, wherein a temperature gradient is formed, and both the atmospheric pressure and the temperature gradient are maintained throughout the process. Formation of a vapor barrier within the chamber that precludes exit of the constituent chemicals, which include silicon, iodine, silicon diiodide, and silicon tetraiodide. The deposition occurs beneath the vapor barrier. One embodiment of the process also includes the use of a blanketing gas that precludes the entrance of oxygen or other impurities. The process is capable of repetition without the need to reset the deposition zone conditions.

6 Claims, 5 Drawing Sheets

OTHER PUBLICATIONS

Figure 1:
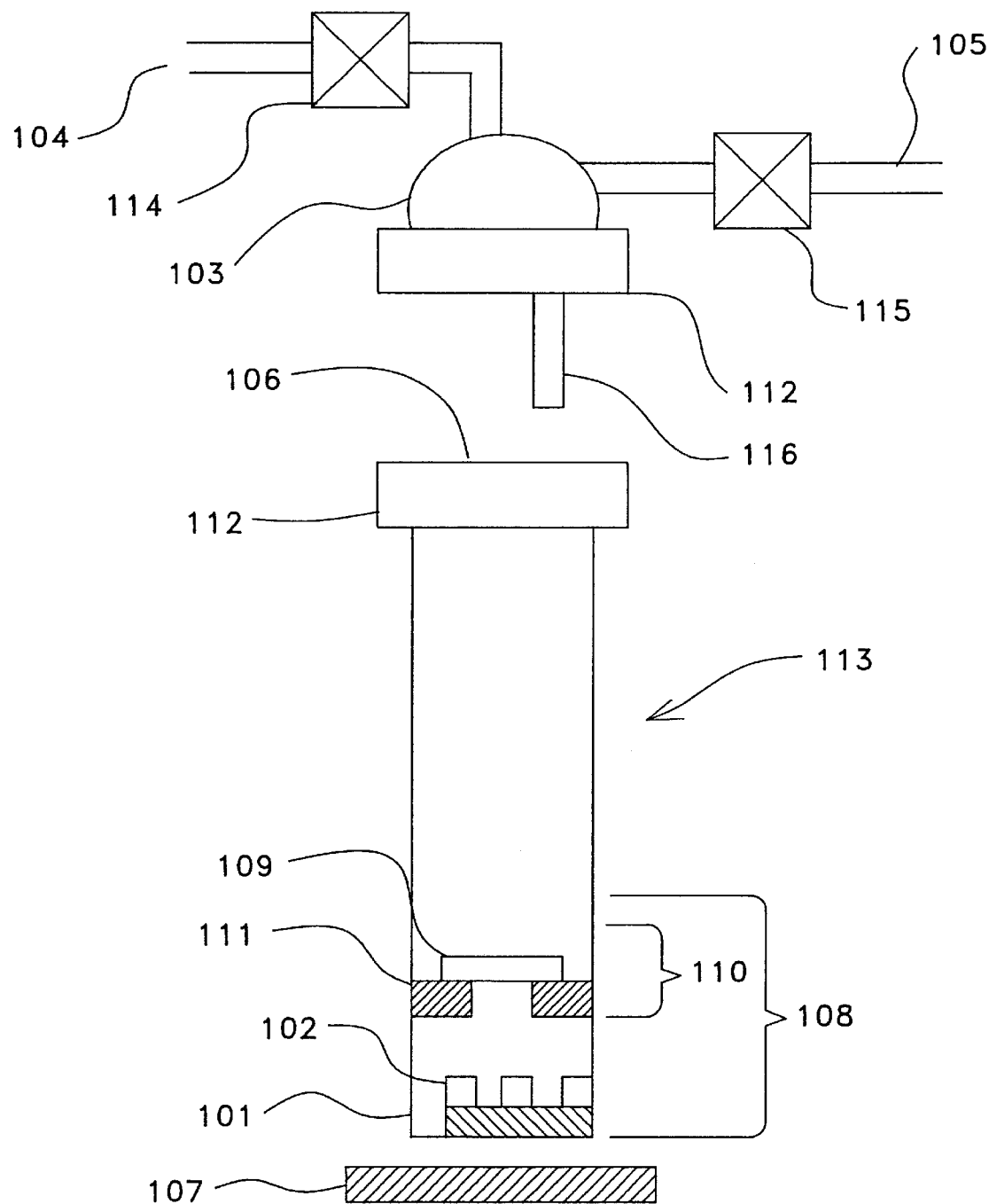

Braun, P.D. et al.., "Local Selective Homoepitaxy of Silicon at Reduced Temperatures Using A Silicon–Iodine Transport System," J. of Crystal Growth. vol. 45, 1978, pp. 118–125.

May, J. "Kinetics of Epitaxial Silicon Deposition by a Low Pressure Iodide Process," J. Electrochem. Soc. vol. 112, No. 7. Jul. 1965, pp. 710–713.

McCarty, L.V., "Electrical Properties of High–Purity Silicon Made From Silicon Tetraiodide," J. Electrochem. Soc. vol. 106, No. 12. Dec. 1959, pp. 1036–1042.

Yamamoto, K., Proc. $2^{nd}$ World Conf. On PV Solar Energy Conversion, 1284 (1998).

Slaoui, A., Proc. $26^{th}$ IEEE PV Specialists Conf., 627 (1997).

* cited by examiner

A 2-MICROMETER THICK POLYCRYSTALLINE SILICON LAYER
OBTAINED AT A SUBSTRATE TEMPERATURE OF 825°C
FOR 15 MINUTES ON A HIGH-TEMPERATURE (96% SILICA) GLASS

A 20-MICROMETER THICK POLYCRYSTALLINE SILICON LAYER
OBTAINED AT A SUBSTRATE TEMPERATURE OF 900°C
FOR 10 MINUTES ON A HIGH-TEMPERATURE (96% SILICA) GLASS

PROCESS FOR POLYCRYSTALLINE FILM SILICON GROWTH

CONTRACTUAL ORIGIN OF THE INVENTION

The United States Government has rights in this invention pursuant to Contract No. DE-AC36-98GO10337 between the United States Department of Energy and the National Renewable Energy Laboratory, a division of Midwest Research Institute.

BACKGROUND OF THE INVENTION

CHEMICAL VAPOR TRANSPORT—general principles

Chemical Vapor Transport (generally known as CVT) is a crystal growth process in which the materials to be grown are transported to the growth zone as volatile compounds that chemically react or decompose to give the material and a by-product. The CVT technique could be used in growth of either bulk crystals or thin films on a substrate. CVT may be categorized as either an open system or a closed system depending on the usage of the gas components. In closed systems, the source material and the growth zone are both contained in a sealed reaction chamber, material transport is accomplished by gas phase diffusion and convection due to temperature difference without the aid of a carrier gas, and the by-product is recycled. The advantage of a closed system is that only a small amount of transport medium is needed, but it is unsuitable for production-scale operation because unloading the grown crystals and replenishing the source material and substrates is inconvenient. In open systems, there is a gas flow through the growth region, the by-products are normally exhausted to waste, and the volatile compounds could be formed by passing an active gas ingredient through a nutrient zone or in a completely separate system. The disadvantage of an open system is the use of a large quantity of the transport medium and handling of effluent, but it allows for the easy removal of growth product and re-introduction of new substrates. In the case of a separate source generation using open systems, the technique is commonly called Chemical Vapor Deposition (CVD). In reality, CVD is essentially one half of the CVT process, thus, claims made regarding the deposition phase of CVT are also germane to CVD processes. The current semiconductor industry almost exclusively uses only CVD processes. In general, commercial CVD silicon processes employ silicon chloride, mono- and poly chlorosilanes, or silane.

CVT is generally carried out in a chamber in which the surface to be coated is isolated from the ambient environment. Before carrying out typical CVT processes, the moisture and oxygen must be purged from the chamber and the surface to be coated. In a typical apparatus for commercial production of coated objects, a load lock (see lexicon) is employed to facilitate removal of coated objects and re-introduction of new substrates to be coated without shutting the system down.

The steps carried out in CVT or CVD growth comprise:

1) Production of a volatile precursor reagent, generally by reaction between a source of the material to be coated onto or grown on a substrate.

2) Transport of the precursor species to a reaction site.

3) Causing a reaction of the precursor species on the surface of a substrate such that it forms a film (coating) or grows bulk crystals on the surface.

Step 1 may be carried out in the CVT apparatus itself, or in a site removed from the coating process when CVD processing is employed. In the semiconductor fabrication industry, nearly all coating precursors are prepared industrially by one company, and shipped to the fabricating facility of a second company which actually manufactures the devices. Step 2 is usually accomplished by a pressure differential (in an open system) or a temperature differential (in a closed system). In most applications, the precursor stream is diluted with a carrier gas. Carrier gas aids in controlling the coating process and in moving materials into and out of the reaction zone (see lexicon). Step 3 is usually carried out by supplying energy to the system either in the form of heat, photon, or radio frequency irradiation. Radio frequency irradiation is used both in conjunction with a susceptor (which converts it to heat energy) or to form plasma. Generation of a plasma aids decomposition of the precursor species leading to film formation on the substrate. In some cases the substrate is heated, and decomposition of the precursor species occurs on the surface of the substrate. In other cases the precursor is decomposed in the gas phase above the substrate, and the building blocks of the desired coating "rain down" on the substrate. In some cases both mechanisms are employed at the same time. Each option influences coating rate, morphology, defect occurrence, quality of coverage, and in some cases coating purity.

It is not unusual, especially in manufacturing electronic devices, that a coated substrate must be further processed after coating. Frequently, the substrate is annealed by heating, or subjected to some other post-coating process such as etching or polishing to reduce defects in the coating or improve the coating quality.

CVT may be used to form films having many different morphologies and characteristics. Epitaxial coatings (see lexicon), most often used in electronic device manufacturing, may be formed through rigorous reaction rate and process control with the same lattice structure in the film as that in the substrate. Polycrystalline coatings (see lexicon) are readily available from chlorosilane-based CVD processes, and both crystal size and size deviation may be controlled through a combination of processing and post processing treatment conditions. Amorphous film (see lexicon) coatings are readily formed when CVD is employed at low temperatures.

In CVT processes, as with other film growth processes, film growth is thought to occur through "nucleation". Nucleation occurs when clusters of atoms that will comprise the film being deposited adhere to the substrate surface on widely scattered sites. These sites promote further growth upon the nucleation sites. Further growth is energetically preferred at nucleation sites that are larger than a critical size than it is at smaller nucleation sites. The critical size depends on the free energy driving force of the growth process, which in turn affects nucleation density on a substrate. In polycrystalline film growth, it is thought that widely scattered nucleation sites (sparse nucleation) leads to the development of large grain sizes. Suppression of secondary nucleation (the formation of new nucleation sites after the initial nucleation sites have developed into crystals) is thought to lead to films with a narrow distribution of crystallite sizes. The prior art in CVT growth of silicon crystals with iodine was not concerned about nucleation on foreign substrates, which is critical in achieving adequate grain sizes for solar cell applications.

The prior art in CVT growth of silicon crystals with iodine as a transport vapor has shown that such a system gives higher growth rates when compared to the silicon-chloride-based CVD processes at the same growth temperatures, but the conditions required (growth had to be carried out in either a sealed chamber, or if carried out in an open system resulted in high iodine consumption), were not suitable for industrial production.

SOLAR CELLS—current art and problems

Solar cells are candidates for use as a source of electricity in an attempt to reduce the dependence of the world on fossil fuel for the production of electricity. Solar cells based upon silicon have long been known, and used very successfully in spacecraft and satellite power systems.

The silicon solar cells employed in high efficiency applications have by-and-large been produced by semiconductor fabrication technology. This is to say that such solar cells have been manufactured from semiconductor grade materials, using techniques developed for fabrication of semiconductor devices on high purity and single crystal wafers. The use of semiconductor materials and technology drives the cost of the electricity produced by such cells to levels exceeding $50/peak watt, even if economies of scale are factored into the cost calculation. Many practitioners in direct solar power conversion believe that for terrestrial solar conversion applications to compete with current commercial technologies, power must be produced at costs of less than $0.50/watt.

High-efficiency solar cells are primarily single crystal silicon devices. They may be obtained either by crystallizing high purity silicon melts into a boule (large single crystal) and cutting the resultant boule into wafers from which the cells are made, or by employing any one of a number of vacuum deposition techniques to form an epitaxial layer of silicon onto a highly purified substrate. In a solar cell, at most only the uppermost 100 microns of material on the face of the device is active in conversion of solar energy, the rest merely functions as a support although it greatly adds to the cost of manufacturing the device.

Silicon solar cells have been produced wherein the active silicon material was not single crystal in form. These devices, although not capable of achieving the peak theoretical power outputs approached by the single crystal silicon solar cells, have performed well enough to be considered commercially viable as power sources, provided their production costs could be reduced to a level near $0.50/watt. Solar cells in this category have been produced that have been based on amorphous silicon (no crystal features ascertainable using x-ray defractometry) and polycrystalline silicon. Amorphous silicon solar cells have suffered from low and unstable efficiency. Polycrystalline devices have been produced with the average grain size ranging from microns to millimeters. The cost of such devices are much lower compared to the single crystal cells but are still well above the target because they are produced using expensive semiconductor fabrication techniques and high purity silicon materials that exhibit a kerf loss similar to that experienced in a boule sawing process.

Many workers in the field of solar cell technology have suggested that the way to reduce the cost of silicon solar cells is to reduce the amount of expensive silicon used in the production of these devices. Savings may be realized by applying a thin layer of active polycrystalline silicon onto an inexpensive substrate, thus using far less silicon than is typically used currently. One of the best techniques for making thin films is CVD (chemical vapor deposition discussed above) because it can deposit polycrystalline thin-layer silicon on a substrate by providing enough driving force for heterogeneous nucleation. Alternatively, when silicon is deposited on a foreign substrate, a preliminary silicon layer which acts to "seed" further silicon grain development may be used at a higher processing cost. However, conventional silicon-chloride/silicon chlorosilanes-based CVD have had only limited success in depositing thin-layer silicon for solar cells. For example, atmospheric pressure CVD achieved fast deposition of polycrystalline silicon layers on foreign substrates by Slaoui, et al. But in order to achieve nearly adequate grain sizes (on the order of film thickness of ~10 micrometers), the deposition has to be done at an elevated substrate temperature of 1200 degree ° C., which speeds up impurity contamination and limits substrate selections. Another example, low-pressure plasma-enhanced CVD has too slow a deposition rate for low cost production, in addition to adding considerably to the equipment cost and complexity through the addition of plasma generating equipment. A challenge now is to find a growth method that produces sparse nucleation on foreign substrates with fast deposition at relatively low temperatures.

Several problems associated with CVD processes may be illustrated by a recent example. The savings realized by employing the less expensive substrate are frequently offset by the increased costs of addressing problems associated with processing difficulties arising from the use of the less expensive substrate, as illustrated in the work of Chu, et al. In this work, a graphite substrate which was about half the cost of a comparably sized silicon wafer was employed. When these workers deposited a silicon film on the graphite, the resulting silicon layer was heavily contaminated by impurities contained in the substrate. This problem required either processing at low temperatures, resulting in a very slow rate of growth of the photoactive silicon layer, or the implementation of a costly multi-step deposition regime. In either case, the increase in cost associated with the process limitations imposed by the use of the substrate nearly equaled the cost savings realized from use of the less expensive substrate. In spite of this, application of a polycrystalline thin film of silicon to a foreign substrate holds great promise for the production of cost-effective solar cells. Because a typical CVD process requires high vacuum equipment, precise reagent control, and an oxygen- and moisture-free environment, great savings could be realized by a process which reduces the rigor of coating requirements as well as foreshortens the time required to apply satisfactory coatings. The nature of CVD generally requires complex load lock and preconditioning chamber equipment to enable new material to be brought into the CVD system. Such equipment adds considerably to the cost of the processing equipment, and operationally it takes considerable production time to move materials through load locks. Alternatively, batch processing requires a more modest initial investment, but requires that the entire system be opened to admit a new batch of substrate material. The downtime required to purge the system each time it is opened is considerable, and so greatly impacts the throughput rate of substrate materials. Generally, in production systems, the increased cost and complexity of load locked systems is more than made up for by the increased throughput realized over sealed, batch type systems.

PROBLEMS ADDRESSED BY PRESENT INVENTION

Production of silicon solar cells having a competitive cost/peak power ratio requires a method of producing high purity silicon polycrystalline films on low cost foreign substrates by a method which entails minimal processing costs and is amenable to high throughput. For optimal performance of silicon solar cells, the photoactive film of polycrystalline devices must have large average crystal size and a narrow crystal size deviation. These requirements are met by devices having a photoactive silicon layer thickness of 10 microns or over, obtained at growth rates of 1 micron/minute or greater, and having a carrier diffusion length (see lexicon) comparable to layer thickness. To fall within the required cost parameters the layer should be deposited on a mechanically strong and inexpensive substrate. High temperature glass (glass having a high silica content) is one such substrate. Other such substrates are refractory oxides, alumino-silicates, and glassy carbon, mullite, silicon carbide, silicon nitride, refractory metals such as (but not limited to) molybdenum, tantalum, and tungstun, and materials which are coated or cased in any high temperature ceramic coating.

The purity and narrow crystal size range required in such films is easily obtained from CVD processes, but current CVD techniques require high growth temperatures to achieve the crystal sizes required, precluding the use of all but refractory materials as substrates. Additionally, as substrate temperature is increased, the likelihood of contamination of the grown layer by impurities from the substrate into the grown silicon layer. CVD processes also typically yield slow film growth rates. Additionally, typical CVD processes utilize carrier gasses, which require process waste gas treatment, and are only amenable to being carried out in a chamber isolated mechanically from ambient atmospheric conditions. Finally, films grown by CVD on foreign substrates may require post-deposition annealing to achieve suitable grain structure to impart desirable electrical properties to the film.

The slow growth rates and the requirement that growth chambers be mechanically isolated from the atmosphere means that for a given investment in equipment, a CVD coating process will have low substrate throughput. Throughput may be improved, as it is in semiconductor device manufacturing, by construction of reaction chambers of sufficient size to handle a large amount of substrate and by the inclusion of load locks to facilitate moving material into and out of the system without exposing the reaction chamber to the atmosphere. Larger reaction chambers require larger and more costly vacuum systems. Larger reaction chambers generally also require complex material manipulation equipment to move the substrate material through the system. Load locks also greatly increase the cost and complexity of processing equipment. Additionally, while a load lock will improve throughput over a simple batch type system, a system having the capability of continuous operation without the need of such an encumbrance would be capable of even greater throughput The prior art in CVT growth of silicon crystals with iodine dealt with both low-pressure and high-pressure regimes of film precursor reagents and transport vapor. Working at low pressures has the disadvantage of small growth rates because the amount of silicon per unit volume of the gas phase is rather small. Low pressure work also has the disadvantage that a vacuum system is needed along with a system to treat the effluent from the vacuum pump, both of which increase processing costs. On the other hand, high-pressure (above atmospheric) regimes will yield faster growth rates but also require a growth system which is mechanically isolated from the ambient environment, increasing processing and equipment costs.

The present invention addresses the problems discussed above in connection with the deposition of thin polycrystalline silicon films on foreign substrates. These problems include the difficulty of attaining fast deposition rates, production of the difficulty of producing film coatings having large grain size and narrow size distribution of crystal grains, high equipment cost, the difficulty of attaining fast substrate throughput rate, and the lack of ease of sample handling. The present invention can be practiced in an open system operating at atmospheric pressure, a closed system, or a hybrid system. The hybrid system contemplated by the present invention has the characteristics of a closed system in that it uses a small fixed amount of transport vapor (e.g. iodine), operates without a carrier gas or an effluent treatment system, and has the characteristic that the area of the apparatus in which deposition of a coating occurs does not need to be isolated from the ambient environment by a mechanical device, reducing equipment cost and increasing throughput rates associated with prior art closed systems.

SUMMARY OF THE PRIOR ART

Herrick has taught that at 600° C. iodine vapors readily react with silicon to produce $SiI_4$, a volatile material. Herrick has further taught that when $SiI_4$ vapor at low pressure is heated to 1000° C. it will decompose to yield solid silicon and iodine vapor. Herrick's work was directed toward methods of obtaining high purity silicon in quantity. Herrick's apparatus consisted of two sealed systems, one for carrying out the reaction between silicon and iodine vapor to form silicon tetraiodide, and a second evacuated system for decomposing the tetraiodide at low pressure to form silicon solid. In Herrick's teaching, the tetraiodide was purified by recrystallization in the first system then transferred to the second system. In the second system the tetraiodide was further purified by fractional distillation prior to being decomposed to silicon metal. McCarty and Moates have taught that a zone refining solid $SiI_4$ improves the purity of bulk silicon deposited from decomposition of the iodide.

The work of Herrick, McCarty, and Moates is not directed at the production of photovoltaic devices or of polycrystalline films but rather at the purification of silicon for use as feedstock in the production of high purity silicon single crystals. The conditions employed in this work are not amenable to the production of polycrystalline silicon films having large average crystal features and a narrow range of crystal sizes, but are directed at the production of bulk crystals of silicon.

Litton et al. have taught that while iodine vapor may readily be used as a chemical transport agent, without intervening purification steps, it does not act to improve the purity of the silicon source material when decomposed thermally. Thus, in a sealed system Litton et. al. were able to transport silicon through a distance of up to 10" (the limit of their apparatus) using iodine vapor as a transport medium. In this work, silicon reacted with iodine, producing silicon tetraiodide vapor, at the bottom of the test cell. In the top of the test cell silicon tetraiodide was decomposed to silicon metal and iodine vapor.

The work of. Litton et al. was directed toward the purification of silicon, specifically the ability of an iodine vapor transport system to preclude metal impurities present in the feedstock from the product silicon bulk crystals. The silicon crystals they recovered from their apparatus were free, bulk crystals growing radially from the decomposition surface (a hot wire). This work was not directed at the production of silicon polycrystalline films, nor were the methods employed in this work amenable to the production of films suitable for use in photovoltaic devices.

May investigated the use of iodine vapor to epitaxially deposit silicon in a reactor with a silicon source and a substrate vertically arranged. Experiments in which the source was positioned above the substrate, and the substrate was positioned above the source were reported. May has taught that iodine may be used to transport silicon efficiently across distances of less than 1 mm in a reactor in which the source of silicon and the substrate upon which silicon was deposited were heated using separate heaters to establish a temperature gradient between the two. Additionally May has taught that silicon may be transported in either direction across the temperature gradient by varying the partial pressure of the iodine vapor present in the reactor. All of May's work required ultrahigh vacuum conditioning of the chamber and substrate, and iodine partial pressures at or below 0.01 atmosphere. The work of May was directed toward conditions that optimize epitaxial deposition of silicon from silicon iodide vapor. The work of May was not directed toward the growth of polycrystalline films, and avoids conditions which would tend to introduce polycrystalline features into the films grown. The conditions disclosed in this work are not suitable for the production of polycrystalline silicon layers for use in photovoltaic devices, in that no such films are produced under the conditions of this work, and conditions leading to polycrystalline films of suitable quality are not taught in this work. Additionally, the growth temperatures disclosed in this work are too high for deposition on any substrate contemplated by the present invention, including but not limited to high temperature glass. Finally, the growth rates achieved by May are 1–2 orders of magnitude slower than those of the present work.

The operations disclosed by Herrick, McCarty, Moates, Litton, and May were all performed under low pressures requiring a vacuum system. Working at low pressures has the disadvantage of small growth rates for a given deposition temperature.

In similar work, Braun et al. studied epitaxial deposition of silicon using iodine vapor as a transport medium in a horizontal reactor. In this work the horizontal reactor was heated in different zones to provide an area in which silicon was etched and another in which it was deposited. The work of Braun has taught that within a given temperature zone of their reactor, the bottom of a vertically positioned substrate is etched, while the upper portions of the substrate receive increasingly heavy silicon deposition as one ascends the substrate. This work was conducted in a sealed system, directed toward epitaxial growth, and employed iodine pressures of 0.5 atmosphere or less. This work did not address the problems of polysilicon film growth and does not teach solutions to the problems of small average crystallite size nor a broad range of feature sizes. Additionally, this work is directed to high vacuum deposition conditions and slow growth rates, conditions unsuitable for commercial production of polysilicon films. Finally, this work is directed exclusively at epitaxial deposition of silicon films.

Glang has taught that the use of iodine for silicon transport is not a practical method of carrying out silicon deposition. Further, Glang has taught that growth of silicon layers via uniform nucleation of silicon deposited from the silicon iodide system is adversely affected by the presence of oxides, such as oxides of silicon. As was mentioned above, uniform nucleation is required in the formation of polycrystalline films with uniform crystal sizes. Glang has further taught that growth rate in the silicon iodide system depends directly upon the difference in temperature between silicon source and the substrate upon which it is deposited. Glang has also taught that growth rate depends directly upon iodine pressure. The teachings of Glang are directed away from the use of silicon iodides as precursor materials for the production of polycrystalline silicon films of suitable quality for use in photovoltaic devices, particularly the use of such a precursor to produce such films on glass (silicon oxide).

Jain has taught that epitaxial silicon films may be grown, albeit at very slow growth rates (0.0125 microns/min), using the reaction of iodine vapor and silicon solid to produce a volatile species within the growth chamber containing the substrate upon which the epitaxial film is grown. Jain teaches that low pressures of iodine vapor are required to grow films. Jain teaches low pressure film growth because the films grown by Jain are directed at epitaxial growth and are produced through hydrogen reduction of silicon diiodide rather than the pyrolytic decomposition of the present invention. At high iodine vapor pressures, the production of silicon tetraiodide is favored over the production of the diiodide. Jain's conditions require the diiodide be present in the film precursor reagent vapor. In addition, the method of Jain requires the presence of a carrier gas to bring iodine vapor in contact with silicon and move the resultant silicon iodides to the substrate for decomposition. Jain has shown examples from this work wherein the iodides of silicon arising from an in situ reaction of iodine vapor and silicon solids are transported over a distance of greater than 2 feet by the carrier gas before decomposition to form a silicon film.

The work of Jain is directed entirely at epitaxial deposition of silicon from the iodide system. Jain's conditions, at variance with the present invention, require a high vacuum and sealed environment, a flow-through system employing carrier gas, and the presence of hydrogen to effect the decomposition of the iodide and formation of silicon films. Additionally, Jain's method requires that multi-zone temperature control be employed whereas the present invention may be practiced using only a single point temperature control device. Finally, the methods taught by Jain result in film growth 1–2 orders of magnitude slower than the present invention.

Szekely has taught that in the decomposition of silicon iodides, hydrogen is useful for scavenging iodine from a surface upon which silicon iodides are being decomposed. In terms of film growth, this scavenging action should improve growth rate by suppressing reverse reaction between iodine liberated by decomposition of $SiI_x$ and silicon being deposited on the surface. Additionally, Szekely notes that when hydrogen is present during the thermal decomposition of silicon iodides, silicon iodides are preferentially reduced over iodides of contaminants present in the source silicon, resulting in a purification of the silicon deposited from the decomposition reaction over the purity of the source silicon. The work of Szekely is directed solely at the production of high-purity silicon in the form of bulk crystals using low purity silicon feedstock, unlike the present invention which produces polycrystalline silicon films suitable for cost effective photovoltaic devices. The work of Szekely is also carried out under low pressure conditions, decomposing the silicon iodides at about 0.15 atmosphere. The conditions taught by Szekely do not address the problems of S polycrystalline film growth of suitable quality for use in photovoltaic devices. The methods taught by Szekely require the presence of hydrogen to decompose the silicon iodide precursor into silicon, unlike the present invention which utilizes thermal decomposition of the coating precursor reagent to deposit a film on a substrate.

All the prior works in CVT growth of silicon using iodine are not directed toward the production of polycrystalline silicon layers for use in photovoltaic devices but directed toward either bulk silicon crystals or epitaxial crystal growth on silicon substrates. Conditions leading to polycrystalline films of suitable quality for photovoltaic solar cells were not taught by any of the prior art.

Drumински has taught that polycrystalline films may be deposited from silane as a precursor at 900 degrees° C., but this work also employed an RF plasma to aid in decomposition of the film precursor reagent leading to coating deposition. This work did not address the problems associated with producing polycrystalline films usable in photovoltaic devices. It concentrated on the production of epitaxial films useful in semiconductor devices. Production of films in this work requires the use of a sealed system and high vacuum conditions, unsuitable for the commercial production of polycrystalline films suitable for use in fabricating photovoltaic devices. To grow films in the system studied required complex feed gas mixtures and careful reagent flow and reactor temperature control. The additional complexity of the equipment required to produce the films at the temperatures studied precludes the methods of this work from use in commercial production of photovoltaic devices.

Chu et. al. have taught that silicon polycrystalline films may be deposited on graphite substrates using either silane or chlorosilane precursors. Chu has taught that the addition of hydrogen and hydrogen chloride were necessary to obtain growth rates in the range of 1 micron/minute and produce silicon films suitable for use in photovoltaic devices. The film growth methods taught in his work are characterized by slow film growth rates (less than 0.1 micron/minute), poor electrical quality due to impurity contamination from the substrate, and a broad range of grain sizes in the films grown. Additionally, the teachings of his work are directed away from the commercial production of such films, in that it teaches the requirement of an open system which is mechanically isolated from the ambient environment. Chu's teaching also requires gaseous reagents in addition to the coating precursor reagent to effect film production. Finally, Chu teaches that extensive post-deposition steps are required to obtain films usable in photovoltaic devices.

Slaoui et al. has taught that polycrystalline films may be deposited by atmospheric pressure rapid thermal CVD using trichlorosilane on silicon oxide substrates. The deposition system is a flow-through type requiring waste gas treatment. Moreover, in order to achieve grain sizes on the order of 1 micron, the substrate temperature has to be raised to 1200 ° C. The high temperature will cause severe impurity contamination when a low-cost substrate that is, by is nature, impure is used. Additionally, the problem of obtaining a narrow grain size distribution was not addressed in this work, unlike the present invention.

Yamamoto, et al. taught that thin film polycrystalline silicon on glass substrates may be obtained by a plasma enhanced CVD process at temperatures as low as a few hundred degrees° C. The conditions employed in this work require that the coating apparatus used to deposit a film on the substrate be fitted with a waste gas treatment system and a vacuum system. Even though suitable solar cell devices were made from a silicon layer only 2-microns in thickness, the growth rate available from the method taught by Yamamoto is only 0.036–0.06 micron/min, making it unsuitable for commercial production. The work of Yamamoto does not address the problems of low cost nor of high substrate throughput required for commercial production of photovoltaic devices because the nature of the processing equipment used to produce films elevates the cost of the films produced far beyond the target levels discussed above.

The present invention embodies a novel process for depositing polycrystalline silicon films having large average crystal size and narrow size distribution onto inexpensive foreign substrates such as high temperature glass. The process aspect of the present invention readily lends itself to being carried out in simple deposition equipment using a batch type of substrate processing. The process aspect of the present invention may be carried out in a sealed system or an open system, but it is not required that the apparatus in which coating is carried out be isolated from the ambient environment using mechanical devices (a sealed system is not required) nor does the present invention require the use of carrier gas (an open system), thus the process aspect of the present invention readily lends itself to being carried out in a hybrid type of coating apparatus which is the apparatus of the present invention. Eliminating the need for carrier gas eliminates waste of transport vapor and coating precursor species through carrying these chemical species out of the system during the coating application. It has the additional benefit that it reduces the generation of waste gases to be treated and permits continuous generation of coating precursor in the reaction chamber while employing a minimum of transport vapor. The "hybrid system" feature of the present invention reduces substrate throughput time by permitting quick insertion and removal of substrate. The hybrid system feature is also amenable to the design of continuous coating equipment. The reduction in structural and operational complexity embodied in the hybrid coating apparatus of the present invention reduces the cost of constructing and operating production-scale coating equipment.

In the present invention, thin layers (up to 100 microns) of polycrystalline silicon were grown on high temperature glass substrates using iodine vapor as a transport medium. Under the conditions disclosed in the present process, deposited films exhibited crystals with an average size of about 10 microns at 900 degree° C. Films containing crystal grains having average sizes of between 1 and 40 microns can be obtained using the methods taught in the present invention. Film growth rates up to 3 microns/minute were achieved. The films grown by the subject process exhibit electrical characteristics satisfactory for solar cells without further processing, and may be removed from the deposition medium without a deleterious effect on the deposited film. The deposition temperature was at least 200 ° C. lower than any previously reported deposition temperature for films of similar morphology and electrical characteristics deposited on similar substrates.

REFERENCES

| 3,006,737 | 10/1961 | Moates et al | 23/264 |
| 3,020,129 | 02/1962 | Herrick | 23/223.5 |
| 4,910,163 | 03/1990 | Jain | 437/81 |

Other Publications

Drumininski, M., J.; Electrochem. Soc. Vol 127, No. 4. 04/80, pp. 957–961

Chu, T. L.; et al., J. Electrochem. Soc. Vol 127, No. 4. 04/80, pp. 957–961

Szekely, B. J.; Electrochem. Soc. Vol 127, No. 4. 04/80, pp. 957–961

Litton, F. B. et al.; J. Electrochem. Soc. Vol 127, No. 4. 04/80, pp. 957–961

Herrick, C. S. et al.; J. Electrochem. Soc. Vol 127, No. 4. 04/80, pp. 957–961

McCarty, L. V.; J. Electrochem. Soc. Vol 127, No. 4. 04/80, pp. 957–961

May, J. E.; J. Electrochem. Soc. Vol 127, No. 4. 04/80, pp. 957–961

Braun, P. D. et al.; J. of Crystal Growth Vol 45, 1978, pp. 118–125

Glang, R. et al.; Chapt. 5 "Silicon" in The Art and Science of Growing Crystals, Wiley+Sons, N.Y. 1963, pp. 80–87.

Slaoui, A.et al, Proc. 26th IEEE PV Specialists Conf., 627 (1997)

Yamamoto, K., et al, Proc. 2nd World Conf. On PV Solar Energy Conversion, 1284 (1998)

SUMMARY OF THE PRESENT INVENTION

The present invention is directed at a process employing chemical vapor transport to grow polycrystalline films on substrates. The present invention is also directed toward apparatus that utilize this process without generating gaseous waste or requiring mechanical devices to isolate the region in which coating takes place from the ambient environment.

One aspect of the present invention is a process for the deposition of a polycrystalline film having physical properties suitable for use in photovoltaic applications onto a substrate dissimilar to the overlying polycrystalline material. Another aspect of the present invention is a reactor design which utilizes the subject process in such a manner that the coating reaction may be carried out continuously without the generation of any gaseous waste. A third aspect of the present invention is utilization of the subject process in such a manner that coating may be carried out continuously by supplying to the containment zone only additional amounts of the coating source reagent (source of the material being applied to a substrate) and a supply of uncoated substrate to the zone in the reactor in which the coating is being applied. A fourth aspect of the present invention is the design of a reactor in which the present process may be carried out without the need for mechanical devices to isolate the zone of reaction in which coating is applied from the ambient environment.

Another aspect of the present invention is that by exposing a substrate to the conditions used to deposit polycrystalline films for a sufficiently long period of time, the substrate may be used to grow crystals of macroscopic dimension. Thus the present invention may be directed at the production of large amounts of crystalline materials of the type produced previously using CVT processes in sealed tubes by employing the features of the present invention which permit the coating reaction to be carried out continuously, and which permit the free addition of source materials into the region in which coating is carried out, as well as the free removal of products from the same region.

One embodiment of the present invention utilizes iodine vapor to transport silicon from a source reagent to a substrate upon which it is deposited as a polycrystalline film. The prior art indicates that silicon iodides are poor precursors for film deposition. While the temperature required for the onset of growth is comparatively low, the iodides tend to yield bulk crystal features when decomposed, generally necessitating low pressures with concomitant slow growth rates to obtain suitable film formation.

Another embodiment of the present invention is directed toward the deposition of polycrystalline films on a substrate that is less expensive than cost of a single crystal slice from a boule. Materials which are contemplated to be suitable substrates for application of films by the present invention include glass with high silica content, alumina, carbon, and alumino-silicates. The prior art indicates that film formation is impeded by surface oxides, indicating that the use of the silicon iodide system is a poor choice to use for the deposition of polycrystalline films on oxide-containing substrates. The inventors have found that the use of iodine as a transport vapor for silicon yields films of superior quality at an enhanced growth rate. The inventors have also found that the present invention yields superior quality films on a high temperature glass substrate such as a high-silica content glass like Vycor® 7913, although the present invention is operative using any glass with a softening point greater than 700° C. Such glasses typically have a silica content exceeding 60% by weight, although it is the softening point and not the silica content is that important to the present invention,. Substrates other than glass are contemplated. Any material which does not deform in the temperatures used in the deposition of a film coating, and which does not react with the reagents employed in the coating reaction or the coating material may be employed as a substrate. Such materials are generally (but not limited to) refractory oxides, metal oxides, refractory metals, glasses, ceramics, ceramic coated materials, graphite, and glassy carbon.

The prior art indicates that because of the highly reversible nature of the decomposition of iodides, film features are expected to be of small average size with a broad distribution of feature sizes. The prior art suggests that only by maintaining low concentrations of reagents near the growth surface can feature size be controlled. The inventors have found that the present invention is operative over a range of total system pressures from sub-atmospheric to above 1 atmosphere, and that the present invention yields films of superior quality for use in photovoltaic devices at atmospheric pressure.

In one embodiment of the present invention, the inventors have found that deposition of films can be carried out in a reactor that is isolated from the ambient environment by a blanket of inert gas. The prior art teaches that film growth can only be carried out in a chamber isolated from the ambient environment by mechanical devices.

In another embodiment of the present invention the inventors have designed an apparatus utilizing the present invention coating process, which permits introduction of batches of substrates into the zone in which deposition of a coating occurs without interrupting the coating reaction occurring within the coating apparatus. In still another embodiment of the present invention, the inventors have designed an apparatus containing multiple zones in which coating reactions are occurring, and a device enabling the transfer of substrates between zones in the apparatus without exposing the substrate to the air or interrupting the coating process in any zone of the apparatus. In this embodiment of the present invention, deposition of coatings having different material properties may be applied sequentially to a substrate.

Additional embodiments of this aspect of the present invention are directed at apparatus designs that permit the passing of continuous lengths of substrate to be coated through a zone in the apparatus in which deposition of a coating is carried out. In one variation of this embodiment, the apparatus design permits coating to be carried out continuously by providing a method of replenishing the source of the coating being deposited on the substrate (coating source reagent) in addition to passing a continuous supply of substrate to be coated through the apparatus.

Common to all apparatus embodied by the present invention is the principle of trapping the chemical species comprising the transport vapor, coating source reagent, and coating precursor reagent in a zone in the apparatus (confinement zone). This method of practicing the subject process permits coating substrates without generating gaseous waste or requiring a continuous supply of fresh transport vapor to the apparatus in which coating is carried out. Although, in the preferred embodiment of the present invention, coating is practiced with all the chemical species involved in the coating process confined in the confinement zone, it is contemplated that the subject process may also be practiced in a flow-through type of apparatus as well. The subject matter of the present invention is particularly pointed out and distinctly claimed in the concluding portion of this specification. However, the organization and method of operation of the invention, together with further advantages and objects thereof, may best be understood by reference to the following description taken in connection with the accompanying drawings.

DRAWINGS

FIG. 1—A schematic drawing of an experimental batch reactor.

Figure 2:
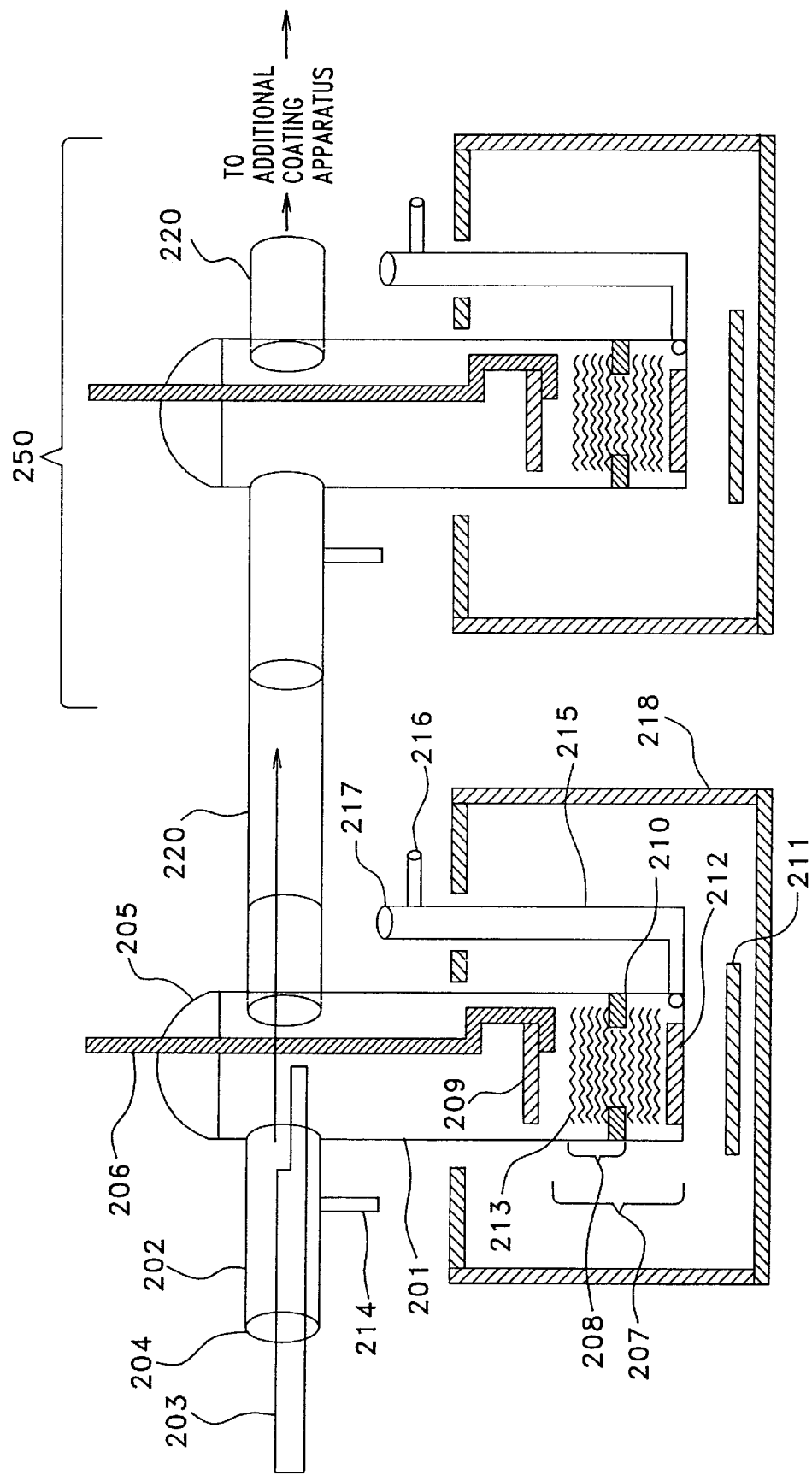

FIG. 2—A schematic drawing of a continuous process batch reactor permitting sequential application of material coating to a given substrate sample.

Figure 3:
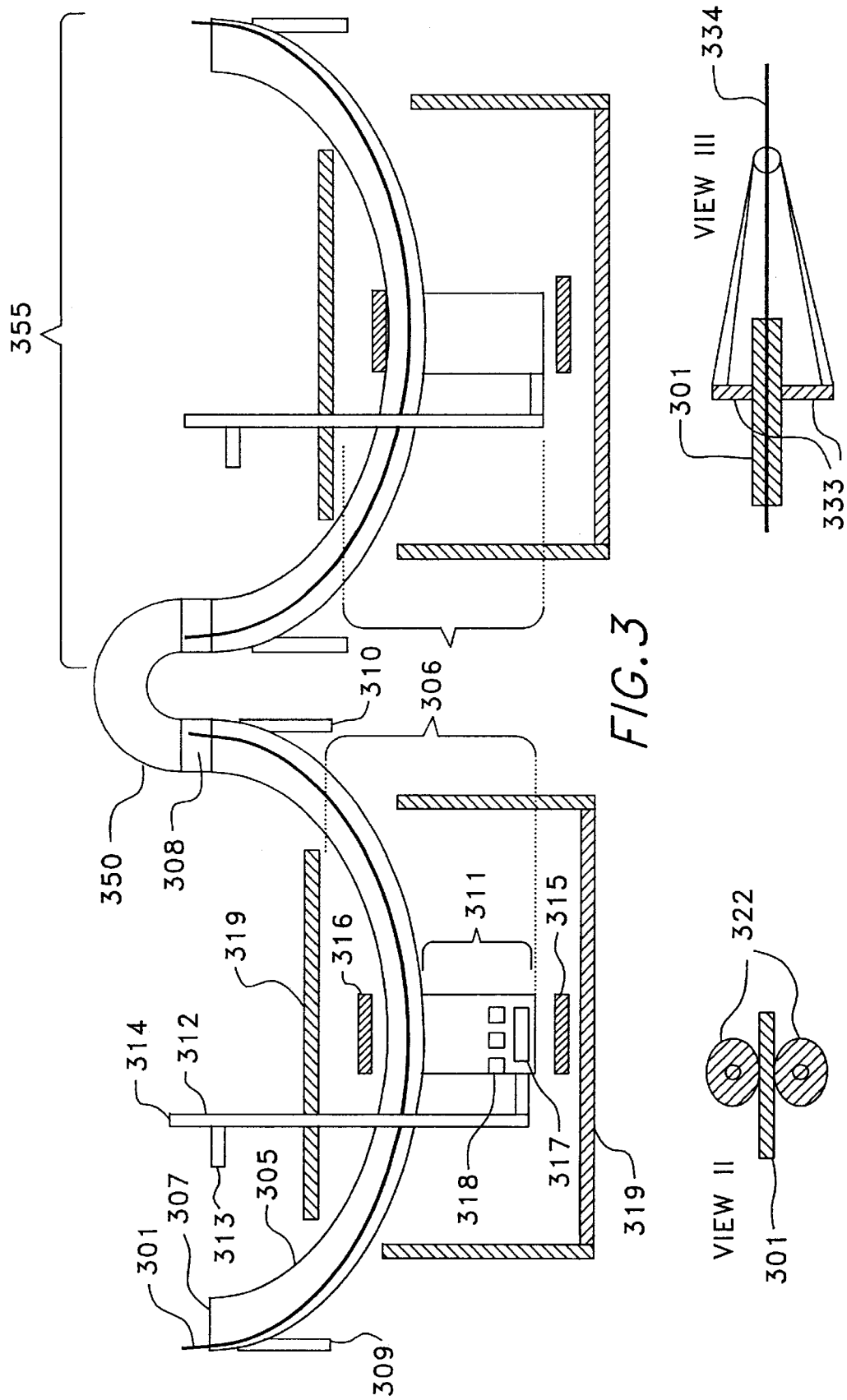

FIG. 3—A schematic drawing of a continuous process reactor

Figure 4:
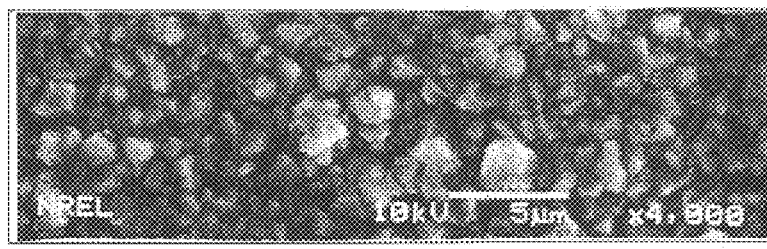

FIG. 4—A 2-micrometer thick polycrystalline silicon layer obtained at a substrate temperature of 825° C. for 15 minutes on a high-temperature (96% silica) glass substrate.

Figure 5:
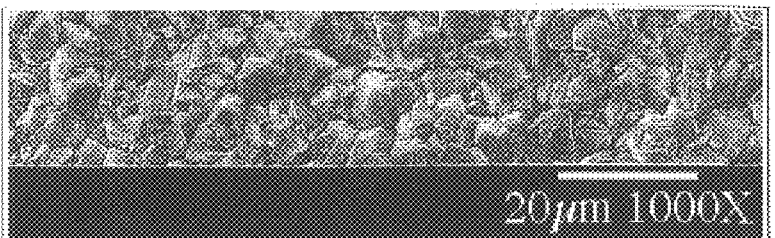

FIG. 5—A 20-micrometer thick polycrystalline silicon layer obtained at a substrate temperature of 900-degree° C. for 10 minutes on a high-temperature (96% silica) glass substrate.

Figure 6:
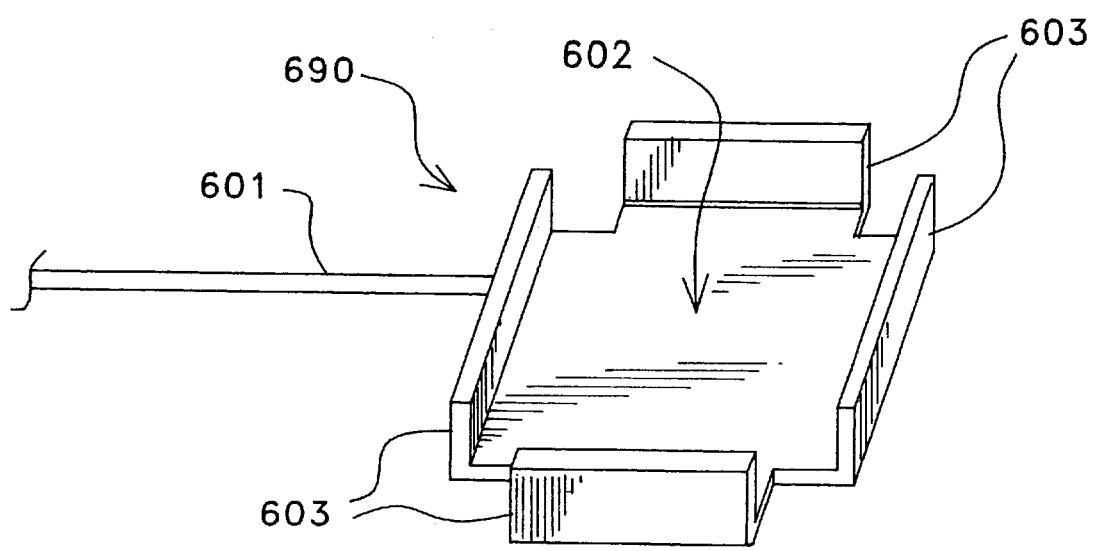

FIG. 6—A schematic drawing of a horizontal holder 690

Figure 7:
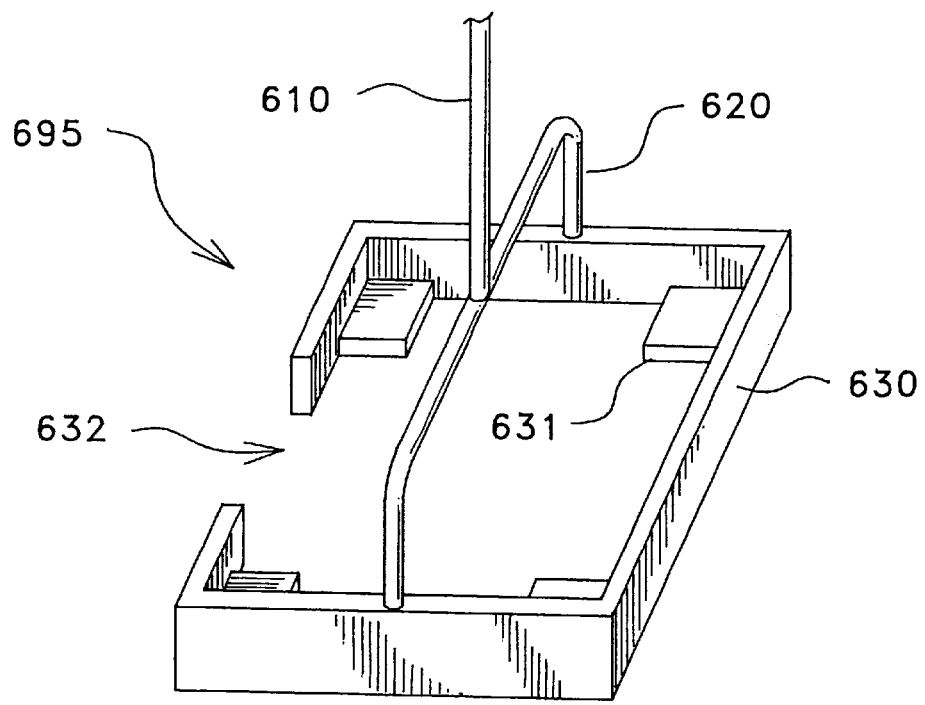

FIG. 7—A schematic drawing of a vertical holder 695

Before explaining the disclosed embodiments of the present invention in detail, it is to be understood that the invention is not limited in its application to the details of the particular arrangements shown, since the invention is capable of other embodiments. Also, the terminology used herein is for the purpose of description and not of limitation.

DETAILED DESCRIPTION OF THE INVENTION

In one embodiment of the present invention process, the chemical species that comprise the coating precursor reagent and transport vapor are confined in a region of the apparatus in which deposit of a coating onto a substrate is carried out (the confinement zone). In such an embodiment, the confinement zone encompasses the region in which transport vapor reacts with the coating source reagent to produce the coating precursor reagent. In FIG. 1 the confinement zone is designated as region 108, in FIG. 2 the confinement zone is designated as region 207, and in FIG. 3, the confinement zone is comprised of the lower portion of U-shaped conduit 305 and reservoir 311 appended to the lowest portion of U-shaped conduit 305. In FIG. 3 the confinement zone is designated as region 306.

In embodiments of the present invention apparatus, confinement of the chemical species employed in coating substrates within the confinement zone is accomplished mechanically by designing the apparatus such that all conduits connected to the apparatus have openings which have a vertical extent above the region of the reactor in which the reagents are confined. This method utilizes gravity to confine reagents to the confinement zone when they are more dense than the purge and blanket gas used in the apparatus. One skilled in the art will appreciate that reagents which are less dense than the purge gas may be confined in a confinement zone by placing openings in the coating apparatus such that they have vertical extent below the confinement zone. An embodiment directed toward the novel process features of the present invention onfines chemical species to the confinement zone of the coating apparatus by establishing a temperature gradient in the confinement zone of the reactor such that the temperature in the lower portion of the confinement zone is sufficient to volatilized the reagents of interest, while the temperature decreases vertically as the confinement zone is ascended. Near the top of the confinement zone, the temperature is such that the reagent of interest condenses on the walls of the coating apparatus and returns to the lower portion of the confinement zone by force of gravity where it is re-vaporized. Both the confinement method arising from embodiments directed toward the apparatus aspects and the confinement method arising from embodiments directed toward the process aspects of the present invention may be simultaneously employed in practicing the present invention.

In one embodiment of the present invention, a source of iodine vapor, such as iodine crystals, is placed together with the coating source reagent, such as silicon, in an apparatus suitable for carrying out the coating process. The region in the coating apparatus containing these reagents is then heated to produce transport vapor (iodine vapor), which reacts with the coating source reagent (silicon) to produce the coating precursor (volatile iodides of silicon). A substrate brought into contact with the coating precursor will have a film of polycrystalline silicon coated onto it. The properties of the coated film may be controlled by controlling the temperature of the coating source reagent (silicon), the temperature of the substrate, the distance that the substrate is held above the coating source reagent, and the pressure of transport vapor (iodine vapor) in the system.

Control of the temperature of the substrate may be accomplished by establishing a temperature gradient within the confinement zone of the coating apparatus in which the chemical species are trapped and locating the substrate in the proper position within the gradient to achieve the desired substrate temperature. The temperature of the substrate may also be controlled directly through a heating means acting on the substrate with a second heating means controlling the temperature of the reaction between transport vapor and the coating source reagent. Heating means employed may be (but are not limited to) a resistance heater, a radiant heater, and electromagnetic radiation sources such as radio frequency energy or a laser. It will be obvious to one skilled in the art that whenever control of temperature is disclosed in the present invention it of necessity implies a source of thermal energy and a means to control the energy output by that source. Control of heaters is contemplated to be accomplished by any number of electrical and electronic devices commercially available and appropriate to the heat source employed Control of the iodine partial pressure is controlled by the molar amount of iodine present within the coating apparatus and the volume of the region of the reactor in which the iodine is confined (confinement zone). The volume of the confinement zone is controlled by the horizontal area of the confinement zone and the vertical extent of the thermal gradient defining the confinement zone. Thus, for a given temperature differential, molar amount of iodine, and fixed reactor cross sectional area, as the confinement zone in increased in height (the temperature change is made more gradual over the extent of the thermal gradient) the molar amount of iodine per volume of confinement zone decreases.

The distance between the substrate and the coating source reagent is controlled by the mechanical means for holding the substrate in the confinement zone during coating. For a substrate located in a region of fixed temperature within the confinement zone, as that temperature region is increasingly far from the coating source reagent, the rate at which coating is applied to the substrate decreases.

One process aspect of the present invention is directed toward depositing a film coating on a substrate by the use of a chemical vapor transport system. In one embodiment of this process, transport vapor is formed within a suitable apparatus. The coating source reagent is then introduced into the transport vapor. The temperature of the transport vapor is raised to a point satisfactory to achieve reaction between the coating source reagent and the transport vapor producing a precursor species to the desired coating (coating precursor reagent, see lexicon). The confinement zone then contains coating source reagent, transport vapor, and coating precursor reagent. A gradient of temperature and the chemical species contained in the confinement zone is established. A suitable substrate is introduced into this temperature/chemical species gradient. A temperature is established in the substrate that is suitable to cause decomposition of the precursor on the substrate, resulting in the production of the film of interest on the substrate and regeneration of the chemical transport vapor.

Alternatively, the source reagent and a source of the transport vapor (e.g. iodine crystals) may be placed together with the substrate to be coated before heating. Heat may then be applied and a temperature/chemical species gradient established as above, resulting in a coating being formed on the substrate.

These two basic process schemes may be practiced in several variations of reactor design. The variants all share the common characteristic of the subdivision of the reactor chamber into three sections defined as a bottom portion, a mid-portion, and a top portion by the chemical reactions that occur within. Thus, with reference to FIG. 1, the reactor 113 is comprised of a quartz glass tube, sealed on one end, and supported vertically with the open end oriented up. The source reagent 101 containing the desired chemical species of the film to be deposited (e.g. silicon nodules and dopants) together with a source of the transport vapor 102 (e.g. iodine crystals) is placed into the reactor through reactor opening 106. The substrate to be coated, 109, is placed on substrate support 111 through the reactor opening 106. Reactor cap 103 (which contains gas conduits 104 and 105) is then fixed to the top of the reactor by means of coupling device 112. The system is flushed by passing inert gas through gas conduit 105 and venting the system through gas conduit 104. Inert gas may be any gas that is compatible with the reagents employed in the coating process, the materials of construction of the reactor, and the composition of the substrate and the coating applied to it. This may include, but is not limited to, the nobel gasses (e.g. helium, neon, argon, krypton, and the like) nitrogen, hydrogen, sulfur hexafluoride, and halogenated hydrocarbons together with mixtures of these gasses. It will be readily appreciated by one skilled in the art that commercially available gaseous reagents all contain varying amounts of other species that are typical for a given grade and type of gas. For example (but not limited to), hydrocarbons and oxygen are commonly found at low levels in commercial grades of argon. When gaseous reagents are specified in the present invention disclosure, it is contemplated that the specified gaseous moiety includes all of the species that are typically present in commercial grades of the gaseous reagents specified.

The system is then heated by a heater 107 located proximate to the bottom of the reactor, thus producing transport vapor in the confinement zone 108 and driving the reaction between the transport vapor and the solid reactant to produce coating precursor in confinement zone 108. By heating the reactor only locally, a temperature/chemical species gradient is established within the confinement zone. When the substrate is placed such that the surface to be coated is oriented horizontally and displaced vertically above the source reagent, the substrate to be coated is located in a zone in which the temperature and chemical composition of its environment is conducive to film deposition. When properly located, film deposition commences on the substrate 109. Substrate 109 is held in the proper location for deposition (deposition zone 110) by support 111. When the substrate has received the desired thickness of coating, power supply to the heating source is discontinued and the reactor is opened. The coated substrate 109 is removed through reactor opening 106.

It will be appreciated by one skilled in the art that the uncoated substrate 109 may be placed into the reactor, and coated substrate 109 may be removed from the reactor using any common tool such as (but not limited to) a forceps, or by employing any device adapted to grip or support the substrate so that it may be removed from the reactor.

It will be appreciated by one skilled in the art that coupling device 112 may be any means used for removably coupling lengths of glass tubing, including (but not limited to) a pair of glass flanges fixed separately to the reactor tube and cap, a compression type coupling, and a ground glass ball and socket joint. It will also be appreciated by one skilled in the art that the reactor may be fashioned from other materials in addition to high temperature glass, such as refractory metals, stainless steel, and refractory oxides.

Gas conduits 104 or 105 may extend into the reactor 113 by having affixed to it conduit extension 116. Gas conduits 104 and 105 may be fitted with flow regulating devices 114, 115 which will be familiar to one skilled in the art, such as shut off valves, needle valves, Firestone valves, gas regulators, and the like.

In one embodiment of the present invention process, a film primarily containing silicon is deposited on a substrate using iodine as the transport vapor and silicon nodules as the coating source reagent. In this embodiment, hydrogen is used as a blanket gas. The chemical species involved in production of the coating are more dense than hydrogen and layer in the confinement zone according to their density during the coating process, thus they are confined in the confinement zone and form a density gradient when the coating apparatus is appropriately oriented in the earth's gravitational field.

In one embodiment of the present invention process utilizing iodine as transport vapor to deposit silicon films, the temperature of the confinement zone is controlled such that a vertical temperature gradient is also established in the confinement zone. In this embodiment, the bottom of this temperature gradient is maintained at a temperature above the onset of the iodine-silicon reaction temperature (600° C.) leading to formation of silicon iodides, and the top portion of the confinement zone is maintained at a temperature above the melting point of iodine (113.7 degree° C.) and below the boiling point of iodine (184.4 degree ° C.). In this embodiment, iodine vapor condenses on the reactor wall at the top of the confinement zone, and flows back to the hotter portion of the confinement zone. The vapors of silicon iodides condense at a temperature higher than the temperature at which iodine condenses, so under these conditions, silicon iodides condense in a region below the top of the confinement zone. In this manner, both transport vapor (iodine) and coating precursor reagent (silicon iodides) are thermally confined in the confinement zone.

The confinement of reagents by gravity and temperature gradient defines a zone in the coating apparatus where a nearly reservoir of transport vapor (e.g. iodine) and coating precursor reagent (e.g. silicon iodide) gas is maintained (the confinement zone). This facet of the process permits the coating process to be carried out in a reactor that does not require a mechanical device to isolate the zone in which coating is carried out from the ambient environment. The region in which coating is carried out may instead be isolated from the ambient environment by using blanketing gas. This aspect of the present invention permits a coating to be deposited on a substrate in a reactor that has no mechanical barrier to transporting objects into the confinement zone (the region where coating is carried out). This hybrid system configuration also permits coating to be carried out without the need to replenish the transport vapor (e.g. iodine) because unlike a prior art open reactor coating apparatus, in which a carrier gas is used the chemical species involved in the coating deposition reactions of this invention are not carried out of the reactor during the coating operation.

FIG. 2 shows in schematic form a production batch type reactor. In this embodiment, the coating reaction may take place continuously within the confinement zone as batches of substrate are conveyed into the coating zone 208. With reference to FIG. 2, this embodiment of the invention may consist of a vertical reaction chamber 201 with access conduit 202 affixed near the top of reaction chamber 201, which serves as an access way into the coating apparatus. Access conduit 202 is fitted with one or more gas conduits 214. Gas conduit(s) 214 conduct hydrogen or inert gas into access conduit 202, passing through access conduit 202 and exiting the apparatus through opening 204 in access conduit 202. Access conduit 202 contains a portion of horizontal holder 203. Horizontal holder 203 is capable of conveying materials through access conduit 202. In one embodiment of this apparatus, horizontal holder 203 is employed only to move substrate into and out of the upper region of reaction chamber 201. In other embodiments, horizontal holder 203 may also be employed to convey source reagent and transport vapor precursor into the reaction chamber 201 as well.

Connected to reaction chamber 201. is cap 205. Cap 205 may be removable affixed to reaction chamber 201 Cap 205 supports a vertical holder 206. Vertical holder 206 is capable of conveying materials from horizontal holder 203 to the bottom of reaction chamber 201 and back again. In one embodiment of this apparatus, vertical holder 206 may receive source reagent and coating precursor from holder 203 and convey it to the confinement zone 207. In other embodiments, vertical holder 206 is used only to convey substrate 209 to be coated into coating region 208 and retrieve coated substrate 209 from coating region 208.

In operation of one embodiment of this apparatus, vertical holder 206 is employed to move a substrate 209 from horizontal holder 203 onto substrate support 210 located in a place appropriate for deposition within deposition zone 208, and retrieve the substrate 209 from substrate support 210 after it is coated, returning it to horizontal holder 203. Alternatively, vertical holder 206 may serve to move a substrate 209 from horizontal holder 203 into deposition zone 208, and serve as a substrate support by holding it at an appropriate place within deposition zone 208. In this embodiment, when substrate 209 has been coated, vertical holder 206 is returned to its raised position and the coated substrate is transferred back to horizontal holder 203.

Another feature of the coating apparatus disclosed in FIG. 2 is heater 211, which is used to establish a temperature gradient along the vertical axis of reaction chamber 201. The top portion of the reaction chamber 201 is to be maintained at a temperature between the melting point and the boiling point of the transport vapor. The bottom of the reaction chamber 201 is maintained at a higher temperature than the top portion of reaction chamber 201 in order to promote reaction between transport vapor 213 (e.g., iodine vapor) and coating source reagent 212 (e.g., silicon nodules) to produce coating precursor species in deposition zone 208.

In one variation of this embodiment, heat shield 218 is employed about the region of the reaction chamber 201 that corresponds to the static confinement zone 207. Heat shield 218 will be appreciated by one skilled in the art to be any type of insulation or insulating device which may be employed to tailor the temperature gradient in the confinement zone 207 appropriate to control the properties of coating being applied. As was disclosed earlier, temperature gradient control is believed to control the equilibrium between various reagents (substrate, coating source reagent, coating precursor reagent, and transport vapor) established in the confinement zone, thereby controlling the material and chemical properties of the coating deposited on the substrate.

It may be appreciated by one skilled in the art that a batch reactor of the type described in FIG. 2 may be expanded in utility by coupling together two or more reaction chambers in a line through extension access conduit 220 to connect additional reaction chambers 250. In this configuration, a given substrate may have sequential coatings applied to it in the various chambers. Using this method, coatings with varying material properties may be applied atop each other continuously as a sample of substrate is passed from one reaction chamber to another. The horizontal holder 203 could be extended through extension access conduit 220 to the upper portion of each such additional linearly disposed reaction chamber 250. In such an embodiment, each additional reaction chamber 250 is a duplicate of the first reaction chamber 201 structure and is equipped with appointments similar to those described for the first reaction chamber 201, including, for example, the vertical holder 206 described above, and thereby permitting materials to be moved into and out of each additional reaction chamber 250. Further, by employing horizontal holder 203, a substrate could be passed among the various linearly disposed reaction chambers 201, 250 without requiring exposure to the atmosphere between the different coating events that occur in the various chambers 201, 250. It will be appreciated by one skilled in the art that horizontal holder 203 and vertical holder 206 are devices familiar to those who practice material manipulation in high vacuum and CVD coating environments. Thus horizontal holder 203 and vertical holder 206 may be mechanical arms or magnetic transport type devices. A simple mechanical type of horizontal holder which may serve the purpose of horizontal holder 203 is shown in FIG. 6 as horizontal holder 690, while a illustrative example of vertical holder which may serve the purpose of vertical holder 206 is shown in FIG. 7 as vertical holder 695.

The features of a simple mechanical horizontal holder design will be appreciated with reference to FIG. 6. Horizontal holder 690 is comprised of an actuating rod 601 which is affixed to material support plate 602. Material support plate 602 is square, and each corner of material support plate 602 is removed to leave a square notch in the plate. The dimensions of the material support plate and the corner notches in it are such that materials placed onto the plate will overhang each of the four corner notches but not hang over the edge of material support plate 602. It will be appreciated that this requirement may be met by material which is square shaped and has a side dimension slightly less than the edge dimension of the material support plate, or by a circular shaped material which has a diameter slightly less than the edge dimension of the material support plate, or any other shape of material which has dimensions that will fit within the area described by the material support plate and extend over the area of notches cut from the material support plate. Fixed to each edge of material support plate 602, perpendicular to the plane of material support plate 602, and dimensioned such that they do not encroach the area notched out of the corners of material support plate 602 are four material retention lips 603. Material retention lips 603 extent above the surface of the plane described by material support plate 602 sufficiently far enough to keep a material placed onto the material support plate from sliding off when horizontal holder 690 is in use.

The features of vertical holder 206 will be appreciated with reference to FIG. 7. Vertical holder 695 is comprised of frame support bracket 620, which has the shape of an inverted "U". The middle of the "U" portion of frame support bracket 620 is fixed to one end of and depends from actuating rod 610. Each depending leg of frame support bracket 620 is fixed to one side of one set of opposing sides of material support frame 630. The distance between the legs of material support bracket 620 is such that horizontal material holder 690 may pass between them when moved along the axis substantially described by actuating rod 601. The length of the legs of frame support bracket 620 are such that when material support frame 630 is attached to them, horizontal holder 690 may pass between the upper portion of frame support bracket 620 and the upper edges of material support frame 630 when it is moved along the axis substantially described by actuating rod 601.

Material support frame 630 is a four sided fixture dimensioned such that it will just accommodate material support plate 602 together with its attached material retention lips 603 within it. Each inside corner of material support frame 630 has two sides of square tab 631 affixed to the bottom edges of the side members comprising that corner of material support frame 630. Square tab 631 is dimensioned such that it will just pass through the notches cut into the corners of material support plate 602.

One side of material support frame 630 substantially parallel to the legs of frame support bracket 620 has a piece cut out of it forming clearance way 632. Clearance way 632 is dimensioned such that material retention lip 603 on horizontal holder 690 adjacent to actuating rod 601 will pass within the clearance way when vertical holder 695 is substantially aligned over horizontal holder 690 and moved along an axis substantially perpendicular to material support plate 602.

In use, material is placed on horizontal holder 690 such that it fits within material retention lips 603 but overhangs the notches cut into the corners of material support plate 602. Vertical holder 695 is brought to a position using actuating rod 610 that movement of horizontal holder 690 along the axis substantially defined by its actuating rod 601 will bring it between the top edges of material support frame 630 and the upper portion of frame support bracket 620. Horizontal holder 690 is then moved along the axis substantially defined by actuating rod 601 until the notches in the corners of material support plate 602 are aligned with square tabs 631 in the corners of material support frame 630. Material support frame 630 is then raised by actuator rod 610 until the bottom of material support frame 630 is disposed above the top of material retention lips 603 of horizontal holder 690. In operation, material which had been resting on material support plate 602 is transferred to square tabs 631 on vertical holder 695. Horizontal holder 690 is then withdrawn from underneath vertical holder 695, and vertical holder 695 is lowered by actuator rod 610 to the desired position.

To transfer material from vertical holder 695 to horizontal holder 690, vertical holder 695 is raised to a position such that it will reside above horizontal holder 690 when horizontal holder is moved along actuator rod 601 in such a manner that it is aligned with vertical holder 695. Horizontal holder is then moved along the axis substantially defined by actuator rod 601 until the notches cut into the corners of material support plate 602 are lined up with square tabs 631 of material support frame 630. Vertical holder 695, containing material retained by square tabs 631 is then lowered until it is in a position such that horizontal holder 690 is disposed between the upper edge of material support frame 630 and the upper "U" portion of frame support bracket 620. Horizontal holder 690 is then withdrawn along the axis substantially defined by actuator rod 601, and material which was resting on square tabs 631 is transferred to material support plate 602.

will be appreciated by one skilled in the art that additionally banks of linearly connected reaction chambers may be connected normal to the axis of horizontal holder 203. In such an arrangement, a substrate could be transferred between rows of reaction chambers by another horizontal holder of like design to horizontal holder 203 operating in an access conduit of like design to access conduit 202 but disposed perpendicularly to access conduit 202.

It may be further appreciated that horizontal material holder 203 and vertical material holder 206 may be supplanted by a conveyor system consisting of a belt, cable, or chain that is fitted with suitable means to grip a substrate and carry it on a continuous path through confinement zone 207 of one or a series of interconnected reaction chambers 201. Such grippers may be of the type 333 shown in FIG. 3b.

With reference to FIG. 2, in one embodiment of the invention, a coating operation is carried out as follows. First, the batch reactor(s) are purged with inert gas through inlet 214. Following satisfactory purging, the transport vapor source (e.g., iodine crystals) and the source reagent 212 (e.g., silicon solid) are introduced into the reactor through opening 217 of reactant charging conduit 215. The reaction chamber 201 is heated via heater 211 and the transport vapor 213 is formed. Continued heating of the reaction chamber 201 raises the temperature in the confinement zone 207 to the point of reaction between the transport vapor 213 and the coating source reagent 212. The coating precursor is formed by reaction between the source reagent 212 and the transport vapor 213. Additional amounts of coating source reagent 212 are introduced as it is consumed during deposition of a film coating using opening 217 in reactant charging conduit 215. Reactant charging conduit 215 is fitted with one or more gas conduits 216. Gas conduit(s) 216 conduct hydrogen or inert gas into reagent charging conduit 215, which passes through reagent charging conduit 215 and exits the apparatus through opening 217 in reactant conduit 215.

A substrate 209 to be coated is transferred into confinement zone 207 of reactor 201 from the ambient environment via placement on horizontal holder 203, thence moved into the top of reactor 201 via access conduit 202 where it is transferred to vertical holder 206. Vertical holder 206 is then passed down reactor 201 to the level of substrate support 210. Substrate 209 is transferred to substrate support 210 and remains there until a film coating has been deposited on it. Alternatively, vertical holder 206 serves both as a conveyance and a substrate support, with substrate support 210 being absent from reactor 201. In the variation, vertical holder 206 is moved until substrate 209 resides in an appropriate place within confinement zone 207 for coating to occur (coating zone 208) where it remains until the application of the coating is complete.

Following the deposition of a film coating, substrate 209 is then transferred from substrate support 210 to vertical holder 206 and transferred to horizontal holder 203. It will be appreciated that in the alternative embodiment wherein vertical holder 206 serves as both substrate support 210 and vertical holder 206 no such transfer is required at the completion of the coating deposition.

Once the coated substrate is transferred to horizontal holder 203 it may thereby be removed from the coating apparatus, or, if multiple reaction chambers 250 are connected in linear disposition via access conduit extension 220, the coated substrate may be conducted to the top of any other reaction chamber 250 residing along access conduit extension 220. Reaction chamber 250 has like design to reaction chamber 201. When horizontal holder 203 is positioned at the top of reaction chamber 250, substrate 209 may be transferred to a vertical holder of like design to vertical holder 206 which resides within reaction chamber 250, and in like manner lowered into the deposition zone within the confinement zone of reaction chamber 250 where it is subject to deposition of additional film coating. It may be appreciated that this may be repeated as many times as is desirable to achieve the coating required in any or all reaction chambers positioned along access conduit extension 220.

In an embodiment of the present invention wherein batch reactors are joined via access conduit extension 220 (as described above) each reaction chamber may be used to apply a coating to a substrate independently from and simultaneously with the others. In such an embodiment of the invention, film precursor having different compositions may be generated in the confinement zone of each individually adjoined reactor. These confinement zones of varying composition may be used to sequentially coat substrates in coatings having different composition or properties without having to change the operational status of any particular reactor or remove the substrate from the system of adjoined reactors.

It will be appreciated by one skilled in the art that reactant charging conduit 215 and its attendant purging conduit(s) 216 may be eliminated for simplicity, and, as discussed above, reagents may be moved into the confinement zone of reactor 201 by using horizontal holder 203 and vertical holder 206.

With reference to FIG. 3, long lengths of a flexible substrate 301 or shorter lengths of rigid substrates on a conveyor belt may be coated in a reactor of small volume by providing a transport mechanism such as shown in FIG. 3a or FIG. 3b for conducting the substrate along a "U" shaped conduit 305. Material enters "U" shaped conduit 305 through conduit entrance 307, thence passes through confinement zone 306, and finally out of conduit exit 308. Conduit entrance 307 and exit 308 are vertically displaced above a reaction chamber 311. "U" shaped conduit entrance 307 is fitted with one or more purge gas conduits 309, which conduct inert gas or hydrogen into "U" shaped conduit 305. From there the purge gas passes up "U" shaped conduit 305 and exits "U" shaped conduit 305 through entrance 307. In a similar manner, "U" shaped conduit exit 308 is fitted with one or more purge gas conduits 310. Purge gas conduit 310 conducts inert gas or hydrogen into "U" shaped conduit 305. From there the purge gas passes up "U" shaped conduit 305 and exits "U" shaped conduit 305 through exit 308. In this manner, confinement zone 306 may be isolated from the ambient environment surrounding the apparatus.

Reaction chamber 311 is appended to "U" shaped conduit 305 about the lowest point of "U" shaped conduit 305. Reaction chamber 311 is dimensioned so that a thermal and chemical species gradient may be established in it in a manner discussed for the operation of deposition reactors in connection with FIG. 1 and 2 described above. Reaction chamber 311 is fitted with a reagent feed conduit 312. The reaction chamber 311 may be charged with materials to produce the transport vapor 318 (e.g. iodine crystals), and coating source reagent 317 (e.g. silicon nodules) through opening 314 in reagent feed conduit 312. Reagent feed conduit 312 is fitted with one or more purge conduits 313. Inert gas or hydrogen is conducted into reagent feed conduit 312 through purge conduit(s) 313. From there the purge gas passes up reagent feed conduit 312 and exits reagent feed conduit 312 through entrance 314.

In operation, the reaction chamber 311 is of suitable dimension to permit sufficient residence time of the substrate to form the desired thickness of coating as it passes through confinement zone 306.

Additional features of a continuous coating apparatus are disclosed as heaters 315 and 316 and heat shield 319. In a continuous process, particularly in reactors of large horizontal dimension, it may be necessary to use multiple heaters to establish the proper vertical temperature gradient which is also isothermal horizontally within the confinement zone 306 across the substrate surface. Heat shield 319 of FIG. 3 may be employed in the manner discussed above for heat shield 218 of FIG. 2. With reference to FIG. 3, this may be any insulating material or device, as will readily be appreciated by one skilled in the art, to produce the desired thermal gradient in the confinement zone 306.

Feed mechanisms are disclosed in FIG. 3a and FIG. 3b. These mechanisms may be a set of driving rollers 322, which push the substrate 301 through the coating apparatus, or some type of conveyor mechanism 334, in which a conveyor such as a belt, chain, or cable has affixed to it a gripping mechanism 333. In operation, gripping mechanism 333 would retain the substrate 301 edge and draw the substrate through the reactor as conveyor 334 is propelled through the reaction chamber. It will be appreciated by one skilled in the art that the conveying or driving mechanism materials of construction must be compatible with the conditions existing in the deposition chamber. In addition, additional guides for the substrate may have to be disposed along the pathway traversed by the substrate on its way through the reactor. Such guiding mechanisms would be familiar to one skilled in the art of steel or sheet glass processing, and may be of a fixed or rotating character.

With reference to FIG. 3, in operation, a continuous process reactor would employ the use of the same thermal and chemical species gradient in the confinement zone 306 as was discussed above for the coating apparatus illustrated by FIGS. 1 and 2. To apply a coating in a continuous reactor of the type illustrated in FIG. 3, first the apparatus would be purged with inert gas through purge conduits 309, 310, and 313. When satisfactorily purged, and with the continued flow of purge gas, transport vapor precursor (e.g., iodine crystals) would be introduced into reaction chamber 311 through charging tube 312 together with coating source reagent 317 (e.g., silicon nodule). The proper temperature gradient would be established via adjustment of heaters 315 and 316 and application of heat shield 319. When the proper conditions were established in confinement zone 306, the substrate would be fed into the inlet at such a rate that it would be satisfactorily coated during its time resident in confinement zone 306. As coating source reagent 317 is consumed in reaction chamber 311, additional amounts of coating source reagent are introduced into reaction chamber 311 via reagent feed conduit 312.

It will be appreciated by one skilled in the art that the coating apparatus described in this embodiment of the invention may consist of a series of U-shaped conduits identical in design to "U" shaped conduit 305 connected together via transfer conduit 350. In this embodiment, outlet 308 of U-shaped conduit 305 is coupled to one end of transfer conduit 350. The other end of transfer conduit 350 is coupled to the inlet of an additional continuous coating apparatus 355 which is of like design to the continuous coating apparatus shown in FIG. 3. In this way, the continuous reactor described in FIG. 3 could be employed to sequentially apply coatings having different composition or properties to a continuous feed of substrate, in the manner described, with reference to FIG. 2, for the linearly coupled array of batch reactors discussed above. It will also be apparent to one skilled in the art that the sequential coating of continuous lengths of substrates could be accomplished by linking completely independent continuous reactors together with a common conveyor system which may transport materials between reactors through the ambient environment.

It will further be apparent to one skilled in the art that a continuous reactor may be operated with the elimination of charging conduit 312 by conveying the materials required to produce the coating precursor into reaction chamber 311 using a conveyor system which passes along the same path that substrate passes. It will be obvious to one skilled in the art that such a system could be employed to pass a continuous supply of coating source reagent into reaction chamber 311, metered according to the surface area of the substrate passed into the coating apparatus. It will also be apparent to one skilled in the art that a similar material metering system could be arranged to operate through charging conduit 312.

EXAMPLE

With reference to FIG. 1, in the preferred embodiment of the invention reactor 113 is a quartz tube 2" in diameter and 15" long, and having one end sealed and the other end fitted with a glass joint. Reactor 113 is placed vertically, with its sealed end residing in a heating mantle and disposed below its open end. Reactor 113 is charged with at least 0.012 grams of iodine crystals per cubic centimeter of confinement zone 108 volume and preferably with between 0.030 and 0.060 grams of iodine crystals per cubic centimeter of confinement zone 108 volume. Thus, in a typical experiment, approximately 10 g of solid iodine, which serves as the source of transport vapor 102, is placed into the bottom of reactor 113. A solid silicon plate having a weight of 5% or greater the weight of iodine added is also placed in the bottom of reactor 113. The amount of silicon added is adjusted such that the mole ratio of silicon to iodine exceeds 1:4. The silicon plate serves as coating source reagent 101. A plate of high-temperature glass (96% silica) is employed as substrate 109, and is placed on support 111 which spaces the substrate 3 mm above coating source reagent 101. Cap 103 is affixed by joint 112 to the top of reactor 113. Cap 103 contains one gas inlet 105 and one gas outlet 104. The apparatus is then purged with argon to remove atmospheric contaminants such as oxygen and water. The apparatus is then filled with hydrogen to react with any residual oxygen remaining in the system. The apparatus is left such that atmospheric pressure is communicated to the blanketing hydrogen gas. The apparatus is then heated via heater 107 to 1100° C. Heating is done to volatilize the iodine (producing transport vapor in the confinement zone 108) and promote reaction between the transport vapor and coating source reagent 101 (the silicon plate) which leads to the production of coating precursor reagent. During heating the partial pressure of iodine approaches one atmosphere because the system is open to atmospheric pressure. The effect of substrate temperature on the resultant film grain size and growth rate using a high temperature glass (96% silica) substrate is shown in FIGS. 4 and 5.

By heating only at the bottom of reactor 113, the desired temperature gradient may be established. When the proper temperature is achieved, and after all reaction equilibria have been established within confinement zone 108, coating precursor reagent and transport vapors form distinct visible layers in confinement zone 108 of reactor 113. Substrate support 111 is positioned so that substrate 109 is positioned between 0.5 mm and 1000 mm vertically displaced above coating source reagent 101. The maximum distance that substrate 109 may be placed from coating source reagent 101 depends upon the thermal gradient established within confinement zone 18. Substrate 109 must reside within the region in which coating precursor reagent resides (silicon iodides), which is shown in FIG. 1 as coating zone 110. The rate at which a coating is deposited on substrate 109 increases as substrate 109 is positioned closer to coating source reagent 101.

In a typical experiment, a substrate sample placed about 3 mm above the source reagent, at which location substrate 109 typically has a temperature of about 900° C. Substrate 109 is usually held in this position (deposition zone 110) for about 10 minutes then removed from reactor 113. It is found to have a coating of polycrystalline silicon containing crystal grains. Varying the deposition conditions with respect to substrate 109 and coating source reagent 101 temperature, the thermal and chemical species gradient in the confinement zone, and the positioning of substrate 109 relative to coating source reagent 101 influences the physical and electrical properties of the polycrystalline layer. Varying these parameters has produced grain sizes between 1 and 40 microns. These parameters have also been adjusted to control the range over which the size of the deposited grains of silicon crystals comprising the deposited polycrystalline film vary. The method of film deposition described above has been employed to produce polycrystalline silicon coatings which are comprised of grains having a size distribution over a range of about 10 microns and having minority carrier lifetimes of 5 microseconds without further processing.

The results that may be achieved by the present invention are illustrated by the photomicrographs shown in FIG. 4 and FIG. 5. Thus, in one experiment, illustrated by FIG. 4, a 2-micrometer thick polycrystalline silicon layer was obtained at a substrate temperature of 825° C. in 15 minutes using a system that was not sealed by a mechanical device (open reactor system), and a partial pressure of iodine vapor near 1 atmosphere. In another experiment, illustrated by FIG. 5, a 20-micrometer thick polycrystalline silicon layer was obtained at a substrate temperature of 900° C. in 10 minutes using a reactor not sealed by a mechanical device with an iodine vapor partial pressure near 1 atmosphere.

Variations on the basic coating procedure disclosed above include elimination of the step involving filling the reactor with hydrogen and instead using only noble gas to blanket the confinement zone, introducing the substrate into the reactor after the precursor reagent has formed, placing a thermal insulating device around the outside of the reactor in the vicinity of the confinement zone to achieve a suitable temperature gradient, positioning the substrate vertically closer or further away from the coating source reagent, and independent control of the substrate and coating source reagent temperature.

Temperatures employed in producing the coating precursor reagent may range from the onset of reaction between the transport vapor and the coating source reagent to the safe working maximum temperature for the material from which the reactor is constructed. The temperature at which a coating is deposited onto the substrate may range form the onset of decomposition of the precursor to the softening point of the substrate. It will be appreciated by one skilled in the art that the embodiment of the present invention using iodine vapor to deposit a film coating of silicon onto a high silica content glass substrate is operative from about 600° C. (onset of reaction between iodine vapor and silicon nodules) to about 1500° C. (softening point of a high temperature glass).

One skilled in the art will readily appreciate that the basic operation of the reactor described in this preferred embodiment is amenable to continuous processing of substrates. Thus, in a production version of the reactor, the top of the reaction chamber may be left open, the region in which coating takes place (confinement region) may be isolated from the atmosphere by sweeping all of the relevant openings of the coating apparatus with inert gas. A simple transport mechanism such as a conveyor belt or chain link mechanism may move a continuous supply of substrates into the reaction zone for coating and back out the top of the reactor. Several wells could be positioned in a common inert gas plenum such that substrates could travel from one to the other for sequential layers of material to be deposited onto them. A device for replenishing the coating source reagent as it is consumed in depositing film coatings could be incorporated, enabling continuous operation of the deposition chamber.

One skilled in the art could further appreciate that the coating source reagent could consist of a solid solution of atoms, rather than a single atomic composition, or a physical mixture of solid reactants or a liquid reagent source. Examples of such a coating source reagent could include, but are not limited to, a solid solution of semiconductor materials, a mixture of semiconductor materials and dopants, and a complex semiconductor material. For any multi-component coating, a ratio of components in solution or mixture could be provided to the reaction chamber such that, if the reaction rate of the individual components of a multi-component coating source reagent with the transport gas and the various decomposition rates of the individual chemical species in the resulting coating precursor reagent vapor on the substrate was taken into account, such a system could yield directly the deposition of doped films (see lexicon) without the necessity of an externally supplied doping gas.

Finally, one skilled in the art can further appreciate that the transport gas need not necessarily be confined to iodine, nor even a single chemical species, but could consist of a mixture of gases which would act as film growth modifiers yielding polycrystalline films of different morphologies and grain size.

Lexicon

Amorphous film—A coating which has none of the long range order characteristics associated with crystalline materials. Amorphous films give no diffraction pattern when subjected to x-ray defractometry. Quartz glass is an example of an amorphous material, its crystalline analog is sand.

Boule—Cylinder of material crystallized as a single crystal

Bubbler—A device used to package, ship, and dispense precursor reagents. Generally made of welded high purity stainless steel, the bubbler consists of an inlet tube, a liquid chamber, and an outlet tube. The inlet tube passes through the top of the bubbler, and is arranged such that it extends nearly to the bottom of the liquid chamber. When filled with precursor, the inlet tube is submerged in the precursor liquid residing in the liquid chamber. The end of the outlet tube attached to the bubbler terminates at the top of the liquid chamber, and is usually protected from admitting entrained precursor liquid by baffling or a metal frit. In use, carrier gas is passed through the inlet tube, bubbles through the precursor liquid, and carriers precursor vapor out of the bubbler via the outlet tube. High vacuum grade valves generally seal the inlet and outlet tubes when the bubbler is not in use.

Carrier—With reference to semiconductor materials, it is the species that are responsible for charge conduction in the material. Carriers are created by intrinsic defects in the structure or dopants added to the material, and exist as energy bands arising form the structure of the semiconductor material.

Carrier diffusion length—a physical description of conduction in a semiconductor. It is similar to the concept of electron drift in a conductor.

Carrier Gas—In CVD processes this is non-reactive gas which is mixed with precursor species vapor. It is generally inert, such as helium, although in some cases it may also enter into the coating forming reaction. The purpose of carrier gas is to act as a diluent in controlling the rate of the coating forming reaction (which effects surface coverage and coating morphology), aid in conveying energy into the decomposition reaction zone, aid in reducing pressure fluctuation in the system (due to consumption of precursor and generation of volatile product species), aid in conveying precursor species to the reaction site, and aid in removing volatile products from the reaction site.

Chemical Vapor Deposition—A technique wherein a chemical species is decomposed on or proximate to a surface in such a manner that the decomposition reaction results in the formation of a layer of material on the surface. CVD may be thought of as a process with the following steps:
1) Conversion of a species of low volatility into a species of high volatility.
2) Transport of the high volatility species to a surface onto which a film is to be deposited.
3) Decomposition of the species in a carefully controlled reaction to form a layer of the original low volatility species onto the surface of interest.

Examples of CVD include the formation of a tungsten film on a semiconductor surface from decomposition of tungsten hexafluoride vapor, and the formation of a silicon carbide film on carbon fiber from the decomposition of a methane/silane equimolar gas mixture.

CVD—See Chemical Vapor Deposition

Closed System—This term refers to the type of apparatus used to carry out a CVT process, it is also termed a "sealed system." In a closed system, the reagents involved in the production of a coating or crystal are placed within the apparatus before the process is started, the system is mechanically sealed (for example, the apparatus may be a glass tube which is sealed by melting the open end(s) shut after it has been charged with the reagents) and then the reaction is initiated. No species involved in the process leaves the apparatus in which the process is carried out during the process, although there is transport of various chemical species within the apparatus during the CVT process.

Coating Source Reagent—Also termed coating source material. It is any material, solution of materials, or mixture of materials which can be reacted with a transport vapor to produce a chemical species that can be transported away from the site of the coating source reagent/transport vapor reaction, and where the chemical species resulting from the reaction between the coating source reagent and the transport vapor can be decomposed at a location any distance from the point of the coating source reagent/transport vapor reaction to give a coating on a substrate of a film or bulk crystal. In the scope of the present invention, the transport vapor is regenerated upon decomposition of the precursor reagent.

Coating Precursor Reagent—Also referred to as a coating precursor. This is a chemical species which can be decomposed to yield a coating on a substrate.

Deposition—The act of placing a coating (a film or collection of bulk crystals) on a substrate.

Dopant—any foreign atom introduced into a single phase material. Occurrence is usually in the part per million—part per billion range.

Doped Films—A film which is largely comprised of a single phase (single or polycrystalline) which contains a low level impurity that is chemically similar, such that it is incorporated into the lattice of the film, but which is either electrically or physically variant from the constituents of the phase in which it resides. The dissimilarity imparts optical or electrical properties to the film which would be absent without the dopant moiety.

Doping Gas—A gaseous dopant.

Epitaxial Coating—This is the application of a film to a single crystal substrate in which the atoms comprising the applied film line up on atoms of the substrate such that the geometry of the substrate is preserved in the applied film layer. When the substrate and film layer are the same material, epitaxial coating is generally done to impart a different defect structure or doping level in the coating than exists in the substrate material. Different materials are frequently epitaxially coated on a given substrate to provide such things as heterojunctions (which may be used in sensor and transistor-like devices), thermal or diffusion barriers, and mechanical protective layers while preserving the underlying atomic geometry for further process steps.

Foreign Substrate—See substrate.

Growth Rate—The time rate change in thickness of a film being deposited on a substrate.

Slow growth is generally in the range of Angstroms/second, moderate growth is in the range of tenths of microns/second, and fast growths rates generally exceed tens of microns/second.

Line of Site Effects—In a physical vapor deposition technique, the material to be coated onto a substrate is heated until it evaporates from its source. This vapor travels from the source to the surface to be coated where it "sticks" to the surface. Generally, the source must be very close to the surface to be coated, and therefore acts like a point source of the coating material. The material travels in a straight line from source to coated surface. If the coated surface has curvature, the thickness of the coating on parts of the surface curving toward the source will be thicker and the thickness of coating on parts of the surface curving away from the source will be thinner than it will be on parts of the surface normal to the source. Additionally, any raised feature of the coated surface will "shadow" areas located beyond the raised feature relative to the source. The result is that the side of the raised feature facing the source will be heavily coated and the opposite side and related normal surface plane will receive little or no coating.

Load Lock—A chamber having two hatches which can be sealed to vacuum tightness. One hatch of the chamber connects to a "clean" system, such as a CVD reaction chamber, the other is capable of being opened to the atmosphere. The load lock chamber is equipped with a vacuum pump separate from that of the "clean" system to which it is connected, and a supply of inert gas. The purpose of a load lock is to facilitate passing material from the atmosphere into the "clean" system (eg CVD reaction chamber) without opening the "clean" system to the atmosphere. The load lock is employed by placing material into the load lock chamber, carrying out several cycles of evacuating the load lock followed by refilling it with inert gas, and then opening the hatch which is connected to the "clean" system and passing material into the clean system. It may also similarity be employed to remove material from the clean system.

Nutrient Zone—The region in a CVT process wherein the transport vapor reacts with the coating source reagent.

Open System—This term refers to the nature of an apparatus used to carry out a CVT or CVD process. In an open system, the chemical species involved in producing the coating of interest are swept through the apparatus by a carrier gas, and do not reside for any length of time in any volume element of the apparatus.

Precursor—A reactive chemical species which is decomposed to form the material it is a precursor to. Generally, a precursor contains sub-molecular units attached to the fundamental atomic "building blocks" of the material it is precursor to. The sub-molecular units are usually designed to improve the volatility of the atomic "building block", and generally leave the reaction site as a highly volatile product (more volatile than the parent precursor species), which facilitates the removal of such product from the reaction zone. An example of such a species is WF6 (tungsten hexafluoride) which is reduced in hydrogen to form tungsten metal and HF (hydrofluoric acid). In this system, WF6 is many orders of magnitude more volatile than tungsten metal. HF is several orders of magnitude more volatile than WF6, and does not attack tungsten metal. Therefore, once formed, the tungsten coating does not evaporate, the decomposition reaction is not reversible, and the reaction products (HF and excess hydrogen) are readily removed from the reaction chamber.

Polycrystalline Film—Also referred to as a Polycrystalline Coating. This is a coating on a substrate which has crystalline characteristics (yields a diffraction pattern) but does not constitute a single crystal. For the purposes of this document, polycrystalline films are composed of many small crystals, randomly oriented in the film. No distinction is made in this document based on average crystal size or mean deviation of crystal size within a film, although in practice these factors are frequently important in describing such coatings.

Reaction Zone—With reference to CVD and CVT processes, it is any area in an apparatus in which one of these processes is carried out wherein a reaction occurs resulting in the production of a precursor reagent, or the decomposition of a precursor reagent.

Static Reactor—A reaction chamber containing an atmosphere of reactive gases which is fixed within the reactor space. Solid materials, such as solid reactant and substrate are moved into and out of the reactive gas atmosphere, but the gaseous atmosphere itself is stagnant within the reaction space.

Confinement Zone—A region in a coating apparatus in which the chemical species involved in deposition of the film coating are contained.

Substrate—Any object having a surface which has received or is to receive a coating. When the composition of the substrate is a material different from the coating applied to it, the substrate is called a foreign substrate.

Transport—See vapor transport.

Transport Vapor—A gaseous chemical reagent which reacts with a solid or liquid substance in one place to produce a volatile compound containing an atom or atoms of the solid substance. The resultant volatile compound is a precursor to a substance of interest, and is decomposed in another space to yield the solid substance of interest and the gaseous chemical reagent.

Vapor Transport—The process of reacting a solid element of low volatility (such as silicon [bp=2355° C.] ) with a vapor phase molecule (such as I2) to produce a volatile molecule (in this example $SiI_4$, bp=287.5° C.) which can be conveyed in the vapor state to a surface for controlled decomposition to yield a film containing the low volatility element. Conveyance contemplates all mechanism by which material might be moved through a physical system, including via pressure differential, pumping, convection, and diffusion. While in the generic sense, embodiment of vapor transport would included entraining the reactive molecule in a carrier gas and conveying such a gas mixture to the site of decomposition.

Having described the invention with particularity, what is claimed is:

1. A process for depositing polycrystalline silicon on a substrate, comprising:

placing iodine source material and silicon source material in a chamber that has a bottom portion, a mid-portion, and a top portion, and maintaining the chamber at about atmospheric pressure;

heating the iodine source material and the silicon source material in the bottom portion of the chamber to a temperature sufficiently high to vaporize the iodine source material and to react some, but not all, of the iodine source material with the silicon source material at atmospheric pressure to create a deposition precursor of silicon diiodide vapor along with silicon tetraiodide vapor while maintaining the atmospheric pressure;

driving the iodine vapor and the silicon diiodide vapor upwardly from the bottom portion of the chamber, through the mid-portion of the chamber, and into the top portion of the chamber to condense the iodine vapor and the silicon diiodide vapor in the top portion of the chamber, including forming a silicon diiodide cloud in the top portion of the chamber, by forming and maintaining a temperature gradient in the chamber, such that the mid-portion has a temperature that is lower than the temperature of the bottom portion, but higher than iodine boiling temperature and higher than silicon diiodide boiling temperature at atmospheric pressure, and such that the top portion has a temperature that is lower than silicon diiodide boiling temperature but higher than iodine melting temperature at atmospheric temperature;

positioning the substrate in the mid-portion of the chamber under the silicon diiodide cloud, but above the silicon source material, where temperature in the mid-portion is enough lower than the temperature of the source material to drive disproportionation of the silicon diiodide into silicon and silicon tetraiodide and thereby deposit silicon on the substrate;

maintaining the temperature gradient and atmospheric pressure in the chamber and allowing the iodine vapor and the silicon diiodide vapor to condense in the top portion of the chamber and to flow back to the bottom portion of the chamber while iodine, silicon, and silicon tetraiodide vapor, in the bottom portion of the chamber continue to react to form additional silicon diiodide vapor for disproportionation and deposition of silicon on the substrate until a desired thickness of silicon is deposited on the substrate; and removing the substrate with the silicon deposited thereon from the chamber.

2. The process of claim 1, including flowing a blanketing gas, which is less dense than, and non-reactive with, iodine vapor, over the iodine vapor in the top portion of the chamber.

3. The process of claim 1, including placing a cap over the top portion of the chamber.

4. The process of claim 1, wherein the substrate is a foreign substrate.

5. The process of claim 1, wherein the substrate comprises an oxide of silicon.

6. The process of claim 5, wherein the substrate comprises silica glass.

* * * * *